United States Patent [19]

Soclof

[11] Patent Number: 4,466,180
[45] Date of Patent: Aug. 21, 1984

[54] METHOD OF MANUFACTURING PUNCH THROUGH VOLTAGE REGULATOR DIODES UTILIZING SHAPING AND SELECTIVE DOPING

[75] Inventor: Sidney I. Soclof, San Gabriel, Calif.

[73] Assignee: Rockwell International Corporation, El Segundo, Calif.

[21] Appl. No.: 277,464

[22] Filed: Jun. 25, 1981

[51] Int. Cl.³ .................. H01L 21/22; H01L 21/76
[52] U.S. Cl. .................. 29/580; 29/576 B; 29/576 W; 29/578; 148/1.5; 148/175; 148/187; 148/190; 156/643; 156/648; 156/653; 357/20; 357/35; 357/45; 357/49
[58] Field of Search .................. 29/576 W, 578, 580, 29/576 B; 148/175, 187, 190, 1.5; 156/643, 648, 653, 662; 357/20, 35, 45, 49, 50

[56] References Cited

U.S. PATENT DOCUMENTS

| | | | |
|---|---|---|---|
| 3,919,005 | 11/1975 | Schinella et al. | 148/175 |
| 4,109,272 | 8/1978 | Herbst et al. | 357/35 |
| 4,110,122 | 8/1978 | Kaplow et al. | 357/49 X |
| 4,131,910 | 12/1978 | Hartman et al. | 357/49 |
| 4,140,558 | 2/1979 | Murphy et al. | 29/580 X |
| 4,264,382 | 4/1981 | Anantha et al. | 29/580 X |
| 4,323,913 | 4/1982 | Murrmann et al. | 357/50 X |

OTHER PUBLICATIONS

Berndlmaier et al., "Lateral PNP Transistor with Minimum Basewidth" I.B.M. Tech. Discl. Bull., vol. 22, No. 10, Mar. 1980, p. 4543.

Primary Examiner—W. G. Saba
Attorney, Agent, or Firm—H. Fredrick Hamann; Wilfred G. Caldwell

[57] ABSTRACT

The invention is a punch through voltage regulator having an active region formed on a substrate by any one of four different methods. Each method includes recessing the substrate substantially along the periphery of the regulator active region, selectively doping the regulator active region through portions of the recess, filling the recesses with substrate oxide to isolate the active region from the substrate and forming conductors to selectively doped portions of the active region to serve as electrode connections. For P doped substrates N type doping is introduced via the recesses and in a second method the recesses are deepened and P type doping is introduced into the substrate to change the doping in the active region. For N doped substrates P type doping is introduced via the recesses and when the recesses are deepened in the fourth method, N type doping is introduced into the substrate to change the doping of the active portion.

5 Claims, 7 Drawing Figures

METHOD OF MANUFACTURING PUNCH THROUGH VOLTAGE REGULATOR DIODES UTILIZING SHAPING AND SELECTIVE DOPING

FIELD OF THE INVENTION

This invention is a novel structure and method for forming a sub-micron dielectrically isolated regulator utilizing VLSI chip processing steps to fabricate up to hundreds of such devices simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also, the dimensions are now comparable to or even smaller than the base widths used for double diffused transistors, i.e., 0.4–1.0 micrometers. From these techniques the novel structure and methods for the regulator with greatly increased control of breakdown voltage have been devolved in unique combination and sequence.

SUMMARY OF THE INVENTION

The invention is a novel lateral NPN or PNP punch through regulator formed on a substrate by recessing the substrate bounding the active region for the regulator, doping spaced apart portions of such region via recesses, and thereafter filling the recesses with field oxide. Conventional electrical connections are established to each of the N+ and P or P+ spaced-apart portions for the regulator.

Figure 7:
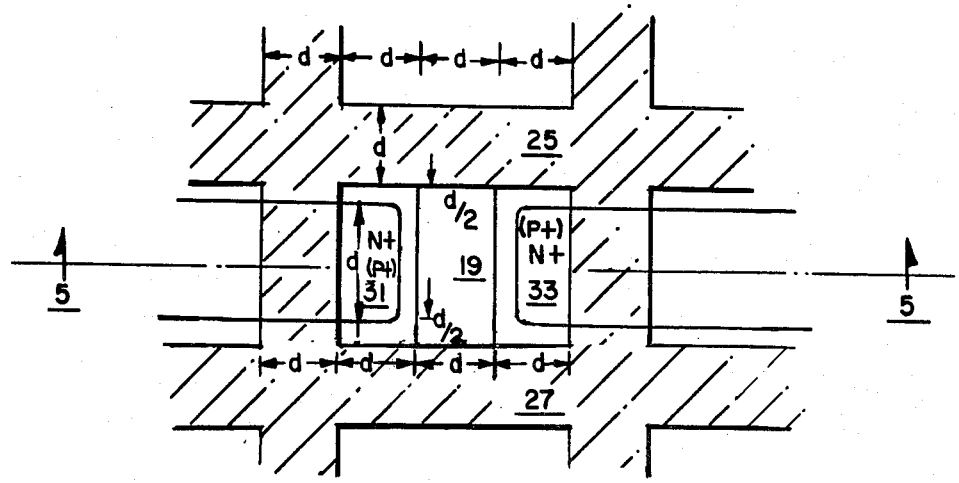

and,

FIG. 7 is a plan view of a single lateral NPN regulator showing the boundary recesses filled with field oxide and the electrodes with electrical connections included.

DESCRIPTION OF THE PREFERRED EMBODIMENT

Breakdown voltage (i.e., punch through) is controlled by substrate doping and, even more importantly, by base width, which in turn is controlled by lateral geometry. The punch through voltage can be adjusted by using an ion implantation after fabrication is completed.

A wide range of breakdown voltages is available even down to values of 1 volt or less. Also, low noise is inherent in this device and likely low temperature coefficient.

The drawings including FIGS. 1–6 show a preferred fabrication method for the structure of FIG. 7 with the steps being recited in preferred order and each function accomplished by a preferred specified processing step.

Figure 1:
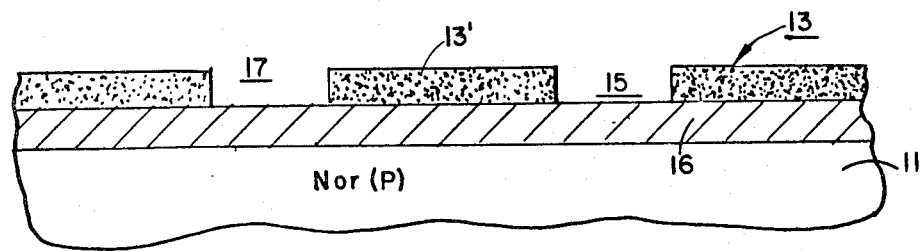
FIG. 1 is a view in cross-section through a region of the substrate where a single regulator will be formed showing photoresist outlining the regions to be recessed into the substrate and also protecting the active region of the regulator.

In FIG. 1 the N or P type substrate 11 may comprise silicon or silicon-on-sapphire. It is covered with a photoresist layer 13 (over an optional silicon oxide layer 16) which is masked, exposed to actinic radiation, and the photoresist removed where soluble in the regions 15 and 17 which outlines the portions of the substrate to be slotted or recessed around the boundary of the active region 19 for a single regulator, shown as that region covered by the photoresist 13'.

Figure 2:
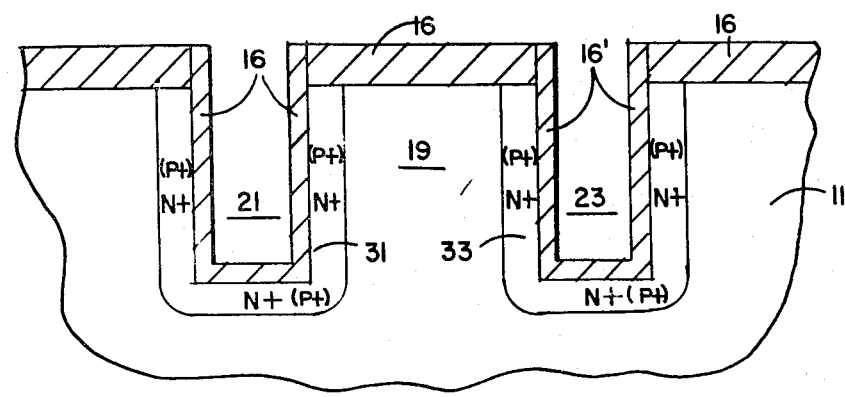
FIG. 2 shows the substrate slotted along the boundary recess regions with N+ doping having been achieved followed by oxide growth. (P+) doping is shown as an alternative to N+ doping to form a PNP.

In FIG. 2 the slots 21 and 23 have been milled into substrate 11 in the regions 17 and 15 while the other regions were protected by the photoresist 13. It will be understood that slots are recesses 21 and 23, as shown in FIG. 2, only bound the active region 19 on two sides, but in reality this boundary recessing or slotting extends completely about the regulator active region 19, as illustrated in FIG. 7 wherein the slot portions 21 and 23 are seen as bounding two sides of region 19 whereas slots 25 and 27 bound the other two sides such that the entire active area 19 is bounded by recesses or slots.

Returning to FIG. 2 the next step in the preferred process for forming a NPN regulator is the deposition of arsenic into slots 21 and 23 to form the N+ doped regions 31 and 33 adjacent to the slots 21 and 23 within substrate 11. If substrate 11 is P doped, an N+PN+ regulator structure is completed except for leads. However, if the substrate is N doped, it may be converted to P doped in the active region by the following steps.

Following the N+ doping step, a silicon oxide may be grown over the entire exposed surface of substrate 11, a shown at 16 and 16', followed by masking.

Figure 3:
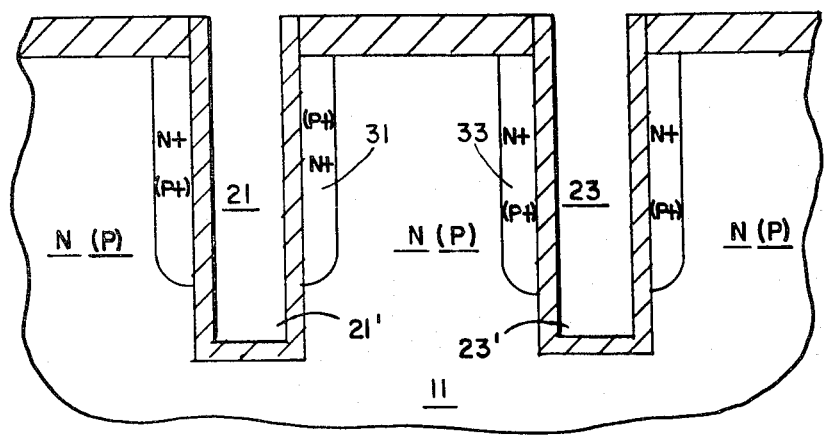
FIG. 3 shows the boundary recesses deepened beyond the N+ doped regions.
Figure 4:
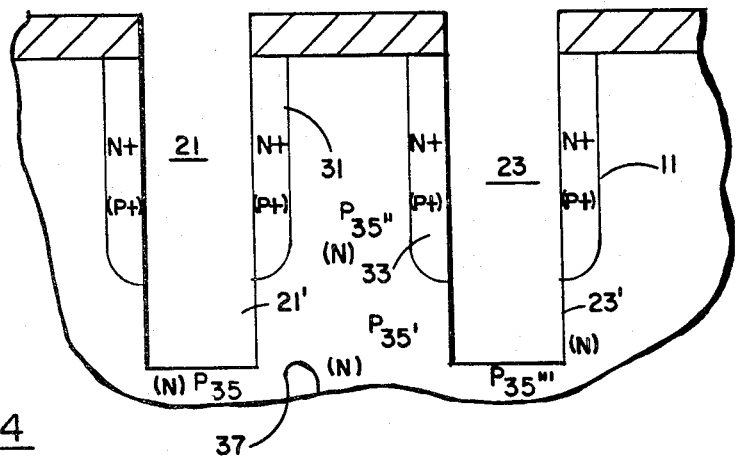
FIG. 4 shows the P region formed by diffusion through the slots and also between the N+ regions.

Proceeding to FIG. 3, the slots 21 and 23 have been milled deeper, as shown by the extensions 21' and 23' which penetrate substrate 11 deeper than the N+ doped regions 31 and 33. Also, the mask and any silicon oxide lining slots 21 and 23, as deepened, is removed following conventional practices to prepare for the boron diffusion step, best depicted in FIG. 4. Here the boron supplied P type regions are indicated at 35, 35', 35" and 35"'. The N type region of substrate 11 is now roughly defined by the line 37. It will be seen that the P region is beneath the slot 21 extension 21' and the slot extension 23', and also occupies the region between the N+ active portions 31 and 33.

Figure 5:
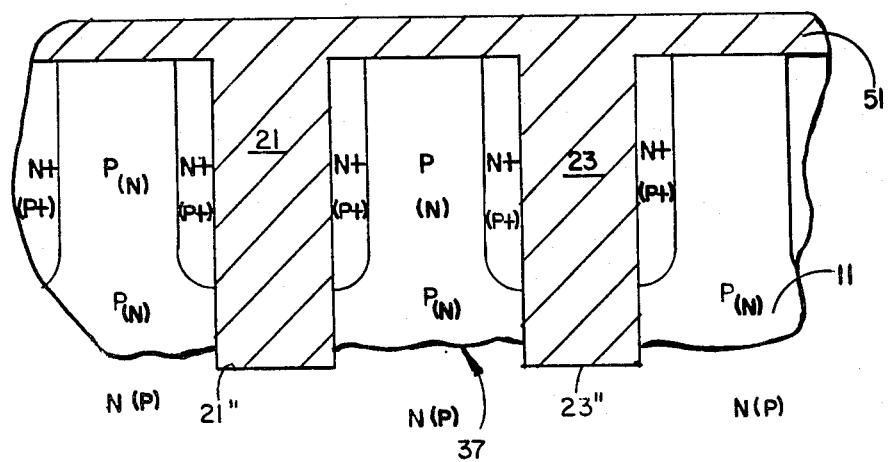
FIG. 5 shows the recessed regions extending into the N doped substrate, beyond the P doped regions and the boundary recesses filled with oxide.

In FIG. 5, the second, deepening of original slots 21 and 23 is effected, again preferably by ion milling, to extend them to their bottoms 21" and 23" which now penetrates the N regin beneath curve 37. The substrate 11 is then oxidized sufficiently to fill the slots 21 and 23 completely with silicon oxide and to cover the substrate 11 with a surface layer 51 of silicon oxide. At this stage it may be noted that the silicon oxide of the recesses or slots completely electrically isolates the N+PN+ active region of the regulator device being formed in the active region within this isolation boundary.

Figure 6:
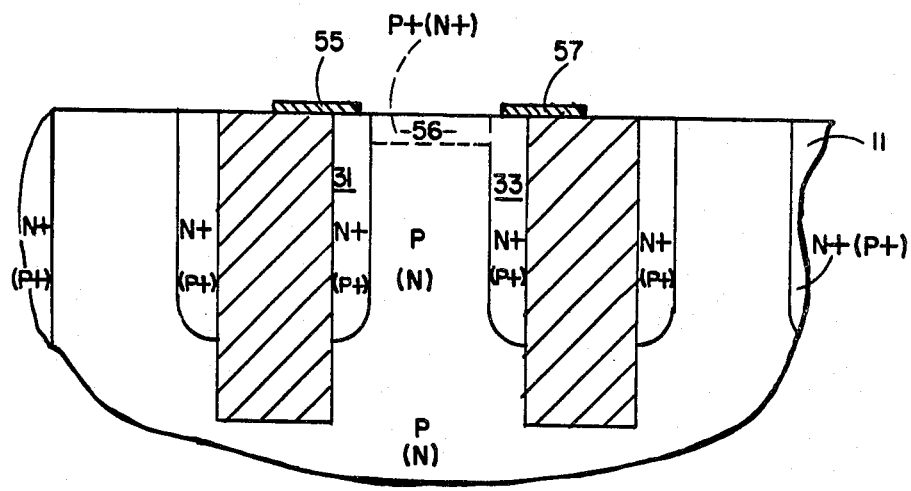
FIG. 6 shows the results of patterning and metallization steps.

Also in FIG. 6 a layer of metallization has been applied to the upper surface of the substrate 11, and it has been covered by photoresist and patterned, then removed where soluble and the metallization etched away to leave the particular metal conductors 55 and 57 shown in contact with the N+ region 31 and the N+ region 33.

It will be noted from FIG. 7 that the sectional view for FIG. 6 is taken along the plane 5—5. Also, the regulator of FIG. 7 is sized 3d×4d to occupy an area of 12d squared, wherein d is a dimension of 0.4 to 1 micrometer. The active region is only 2d×6d squared.

In summary, these bipolar regulators have extremely small areas, and the total size of the regulator is not much greater than its active area.

PNP regulators may be constructed in the same manner simply by starting with a N doped substrate and utilizing P or P+ doping (boron) in lieu of the N or N+ doping illustrated. Also, PNP regulators may be simply made by using a N doped substrate 11 and the initial P+ boron doping of FIG. 2 plus electrodes.

The four methods disclosed herein are set forth, in brief, in the following table:

| P Doped Substrate<br>(N + PN + regulator) | P Doped Substrate<br>(P + NP + regulator) |
|---|---|
| 1. Mask | 1. Mask |
| 2. Slot | 2. Slot |
| 3. N (arsenic) dope | 3. N (arsenic) dope |
| 4. Oxidize | 4. Deepen slots |
| 5. Electrodes | 5. P + (boron) dope |
|  | 6. Deepen into P region |
|  | 7. Oxidize |
|  | 8. Electrodes |
| N Doped Substrate | N Doped Substrate |
| 1. Mask | 1. Mask |
| 2. Slot | 2. Slot |
| 3. N + (arsenic) dope | 3. P + (boron) dope |
| 4. Deepen slots | 4. Oxidize |
| 5. P (boron) dope | 5. Electrodes |
| 6. Deepen Slots into N region |  |
| 7. Oxidize |  |
| 8. Electrodes |  |

An optional P+ doping (N+) (FIG. 6) may be diffused or impacted into substrate 11 adjacent its surface and between the electrode regions to force the current flow downwardly away from the surface, thereby assuring more constant characteristics.

What is claimed is:

1. A method for forming an array of sub-micron dimensioned NPN or PNP lateral regulators in a substrate doped one type, wherein each transistor is formed comprising the following steps:
   masking the substrate to outline a pair of opposed boundary regions for each active region to comprise a regulator;
   slotting the substrate in said boundary regions to provide a pair of substantially parallel slots;
   doping the substrate via the slots to render regions of the substrate adjacent the slots doped said one one type;
   deepening the slots to extend beneath the doped adjacent substrate;
   doping the substrate via the deepened slots to render regions of the substrate beneath and between the so-doped regions doped the other type;
   slotting the substrate orthogonally to said slots by a further pair of slots thereby defining the regulator body;
   filling the slots with field oxide;
   metallizing and patterning said substrate to provide electrical connections to each of said one type regions.

2. The method of claim 1, wherein:
   said slotting and deepening is effected by ion milling.

3. The method of claim 2, wherein:
   said one type doping is achieved by diffusion following oxidation of the substrate and removal of the oxide from the slotted boundary regions.

4. The method of making an NPN type lateral regulator in a N doped substrate, comprising the steps of:
   forming opposed pairs of orthogonally related slots in the substrate bounding the region for the regulator;
   N+ doping via opposed slots of a first pair spaced apart portions of said regions respectively adjacent to the slots of said first pair;
   deepening the slots;
   P doping the non N+ doped portions of said regulator region via the deepened first pair of slots;
   further deepening the slots into the original N doping;
   filling said slots with field oxide; and,
   establishing electrical connections to each of said N+ spaced apart portions.

5. The method of making a PNP type lateral regulator in a P doped substrate, comprising the steps of:
   forming opposed pairs of orthogonally related slots in the substrate bounding the region for the regulator;
   N doping via opposed slots of a first pair the active regions of the substrate respectively adjacent to the slots of said first pair;
   deepening the slots;
   P+ doping spaced apart portions of said regulator regions via the deepened first pair of slots;
   further deepening the slots into the original P doping;
   filling said slots with field oxide; and,
   establishing electrical connections to each of said P+ spaced apart portions.

* * * * *

UNITED STATES PATENT AND TRADEMARK OFFICE
CERTIFICATE OF CORRECTION

PATENT NO. : 4,466,180
DATED : August 21, 1984
INVENTOR(S) : Sidney I. Soclof

It is certified that error appears in the above-identified patent and that said Letters Patent are hereby corrected as shown below:

Column 3, line 7, please change "2dX6d" to read ---2dX3d or 6d---.

Column 4, line 4, please delete the second "one".

Signed and Sealed this

Fourth Day of June 1985

[SEAL]

Attest:

DONALD J. QUIGG

Attesting Officer     Acting Commissioner of Patents and Trademarks